US011865587B2

(12) United States Patent
Ku

(10) Patent No.: US 11,865,587 B2
(45) Date of Patent: Jan. 9, 2024

(54) CYLINDRICAL BATTERY CELL SORTING APPARATUS AND SORTING METHOD USING THE SAME

(71) Applicant: LG ENERGY SOLUTION, LTD., Seoul (KR)

(72) Inventor: Jin Woo Ku, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 134 days.

(21) Appl. No.: 17/609,147

(22) PCT Filed: Dec. 21, 2020

(86) PCT No.: PCT/KR2020/018804
§ 371 (c)(1),
(2) Date: Nov. 5, 2021

(87) PCT Pub. No.: WO2021/141285
PCT Pub. Date: Jul. 15, 2021

(65) Prior Publication Data
US 2022/0219204 A1    Jul. 14, 2022

(30) Foreign Application Priority Data

Jan. 6, 2020   (KR) .................. 10-2020-0001349

(51) Int. Cl.
*B07C 5/344*   (2006.01)
*B07C 5/36*    (2006.01)
(Continued)

(52) U.S. Cl.
CPC ............... *B07C 5/34* (2013.01); *B07C 5/344* (2013.01); *B07C 5/36* (2013.01); *B07C 5/38* (2013.01);
(Continued)

(58) Field of Classification Search
CPC ............ H01M 10/4285; H01M 10/48; H01M 50/569; B07C 5/344; B07C 5/38
(Continued)

(56) References Cited

U.S. PATENT DOCUMENTS 5,673,540 A    10/1997   Sanukiya et al.
8,519,715 B2 *  8/2013   Toomre ............... H01M 50/227
                                              324/426
(Continued)

FOREIGN PATENT DOCUMENTS

CN    103228370 A    7/2013
CN    204431270 U    7/2015
(Continued)

OTHER PUBLICATIONS

Jin; Hyo, "Battery Cell Case and Battery Pack Comprising the Same" (English Translation), Aug. 4, 2014, worldwide.espacenet.com (Year: 2014).*
(Continued)

*Primary Examiner* — Michael McCullough
*Assistant Examiner* — Molly K Devine
(74) *Attorney, Agent, or Firm* — Birch, Stewart, Kolasch & Birch, LLP

(57) ABSTRACT

Discussed is a battery cell sorting apparatus including a battery cell pickup member configured to move a battery cell to a desired position; and a guide member configured to guide the battery cell pickup member in a first direction, wherein the battery cell pickup member includes: a pickup body portion, a magnet located at a lower surface of the pickup body portion, the magnet being configured to lift the battery cell, and a voltage measurement unit located at a lower surface of the magnet, the voltage measurement unit being configured to measure a voltage of the battery cell.

18 Claims, 7 Drawing Sheets

(51) Int. Cl.
  *B07C 5/38* (2006.01)
  *H01M 10/42* (2006.01)
  *H01M 10/48* (2006.01)
  *H01M 10/04* (2006.01)
  *G01R 31/385* (2019.01)
  *B07C 5/02* (2006.01)
  *B07C 5/34* (2006.01)
  *H01M 50/213* (2021.01)

(52) U.S. Cl.
  CPC ....... *H01M 10/42* (2013.01); *H01M 10/4285* (2013.01); *H01M 10/48* (2013.01); *H01M 50/213* (2021.01); *H01M 10/0422* (2013.01)

(58) Field of Classification Search
  USPC ........................................................ 209/552
  See application file for complete search history.

(56) References Cited

U.S. PATENT DOCUMENTS

| | | | |
|---|---|---|---|
| 2008/0137807 A1 | 6/2008 | Yukisada et al. | |
| 2011/0234232 A1 | 9/2011 | Ro | |
| 2013/0175206 A1 | 7/2013 | Li et al. | |
| 2013/0317639 A1 | 11/2013 | Choi et al. | |

FOREIGN PATENT DOCUMENTS

| | | | | | |
|---|---|---|---|---|---|
| CN | 107594968 | A | 2/2018 | | |
| CN | 108081299 | A | 5/2018 | | |
| CN | 207463651 | U | 6/2018 | | |
| CN | 108393911 | A | 8/2018 | | |
| CN | 207710814 | U | 8/2018 | | |
| JP | 6-24415 | A | 2/1994 | | |
| JP | 6-64753 | A | 3/1994 | | |
| JP | 9-73888 | A | 3/1997 | | |
| JP | 9-320644 | A | 12/1997 | | |
| JP | 10-321250 | A | 12/1998 | | |
| JP | 2006-185760 | A | 7/2006 | | |
| JP | 3148830 | U | 3/2009 | | |
| JP | 2010-283640 | A | 12/2010 | | |
| KR | 10-0144597 | B1 | 3/1997 | | |
| KR | 10-2005-0002233 | A | 1/2005 | | |
| KR | 10-2005-0072354 | A | 7/2005 | | |
| KR | 10-2011-0107070 | A | 9/2011 | | |
| KR | 20140095660 | A | * 8/2014 | ............ | H01M 10/60 |
| KR | 10-2016-0051063 | A | 5/2016 | | |
| KR | 10-2016-0075088 | A | 6/2016 | | |
| KR | 10-2017-0065764 | A | 6/2017 | | |
| KR | 10-2019-0025404 | A | 3/2019 | | |
| KR | 10-1983849 | B1 | 9/2019 | | |
| WO | WO 2012/082922 | A1 | 6/2012 | | |

OTHER PUBLICATIONS

Woo; Young, "Battery Cell Sorting Machine and Sorting Method Using the Same" (English Translation), Jul. 11, 2005, worldwide. espacenet.com (Year: 2005).*

International Search Report (PCT/ISA/210) issued in PCT/KR2020/018804, dated Mar. 24, 2021.

Extended European Search Report for European Application No. 20912170.6, dated Jul. 5, 2022.

* cited by examiner

[FIG. 1]
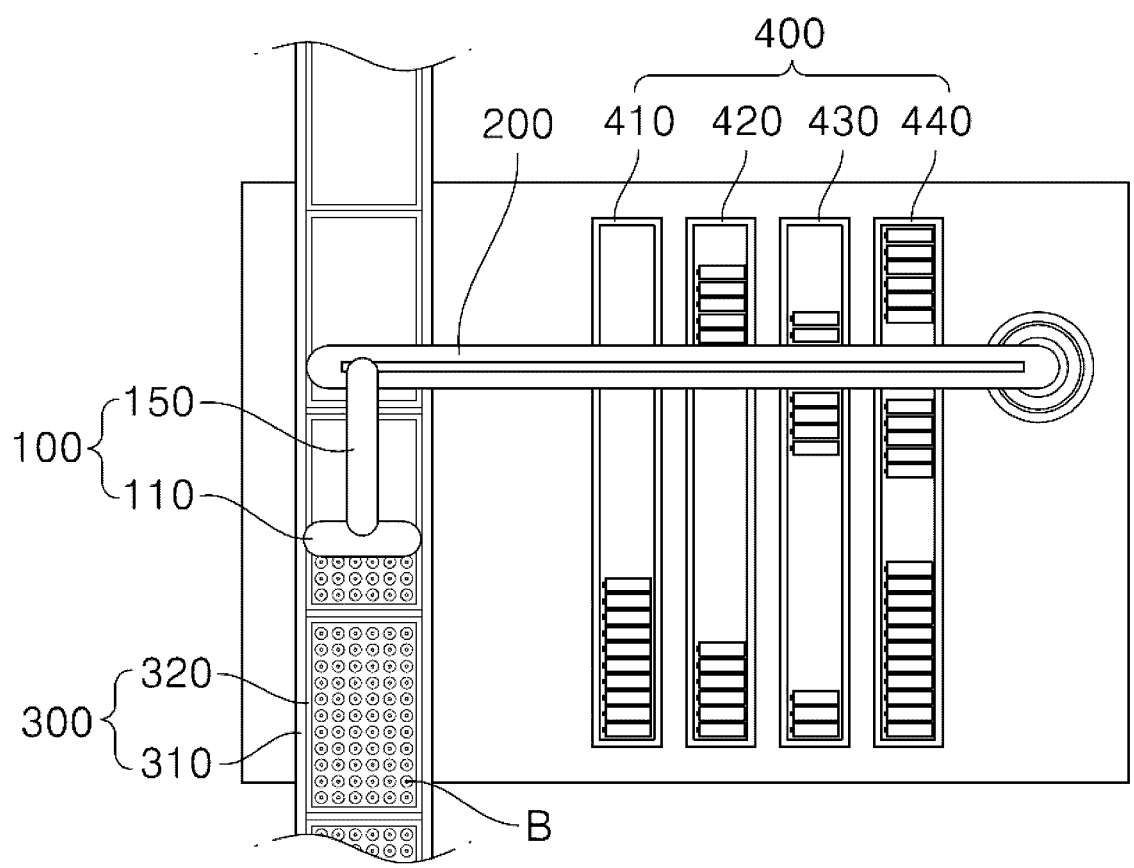

[FIG. 2]
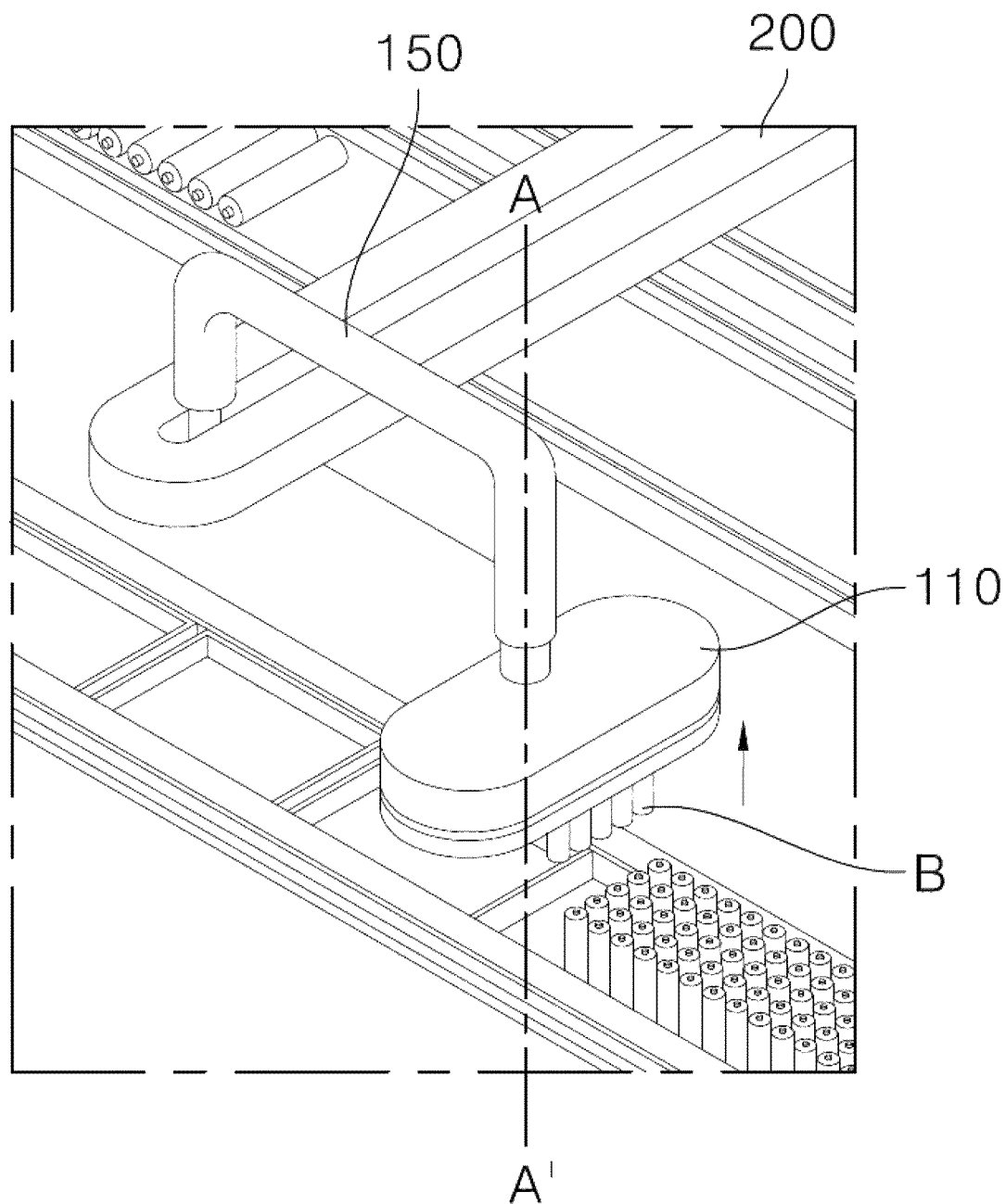

[FIG. 3]
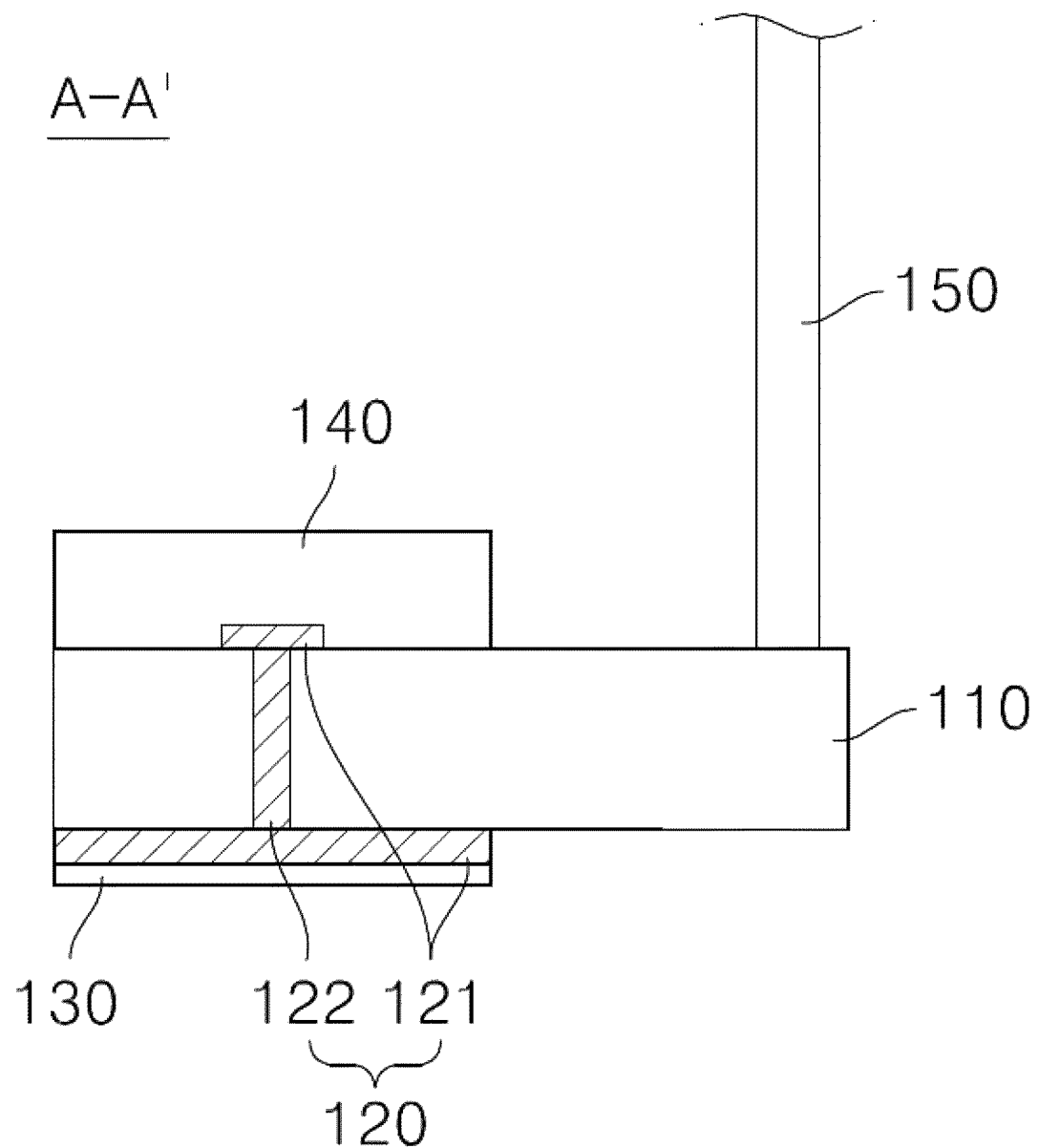

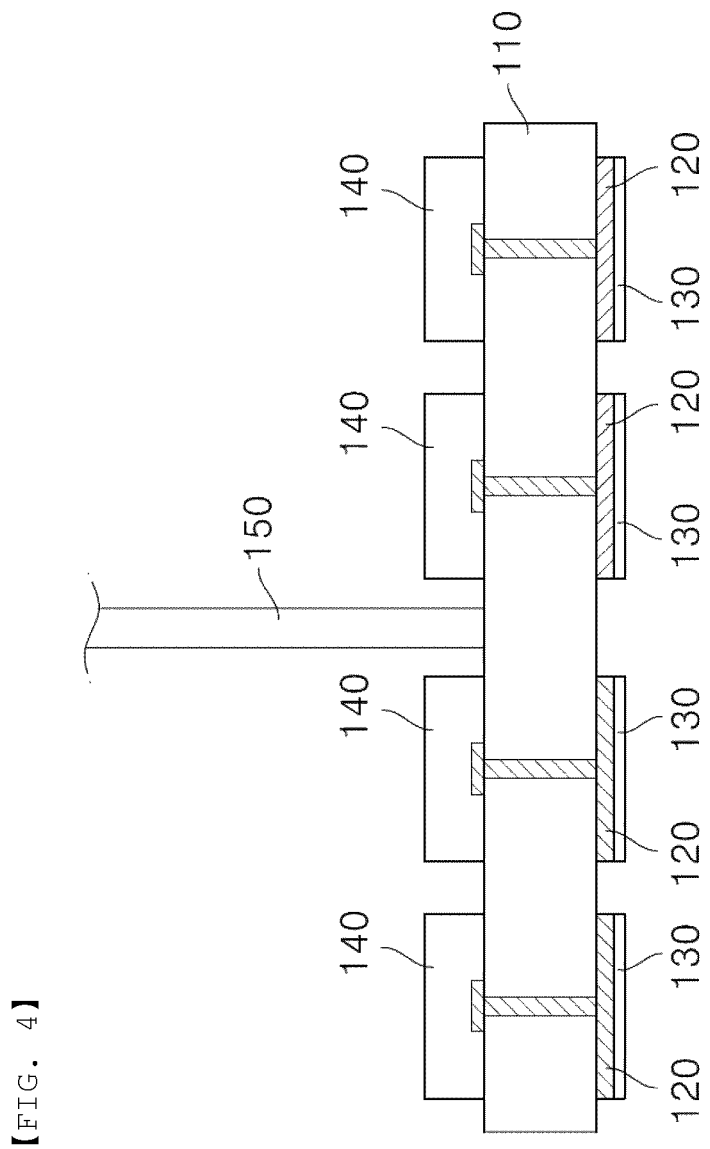
[FIG. 4]

[FIG. 5]
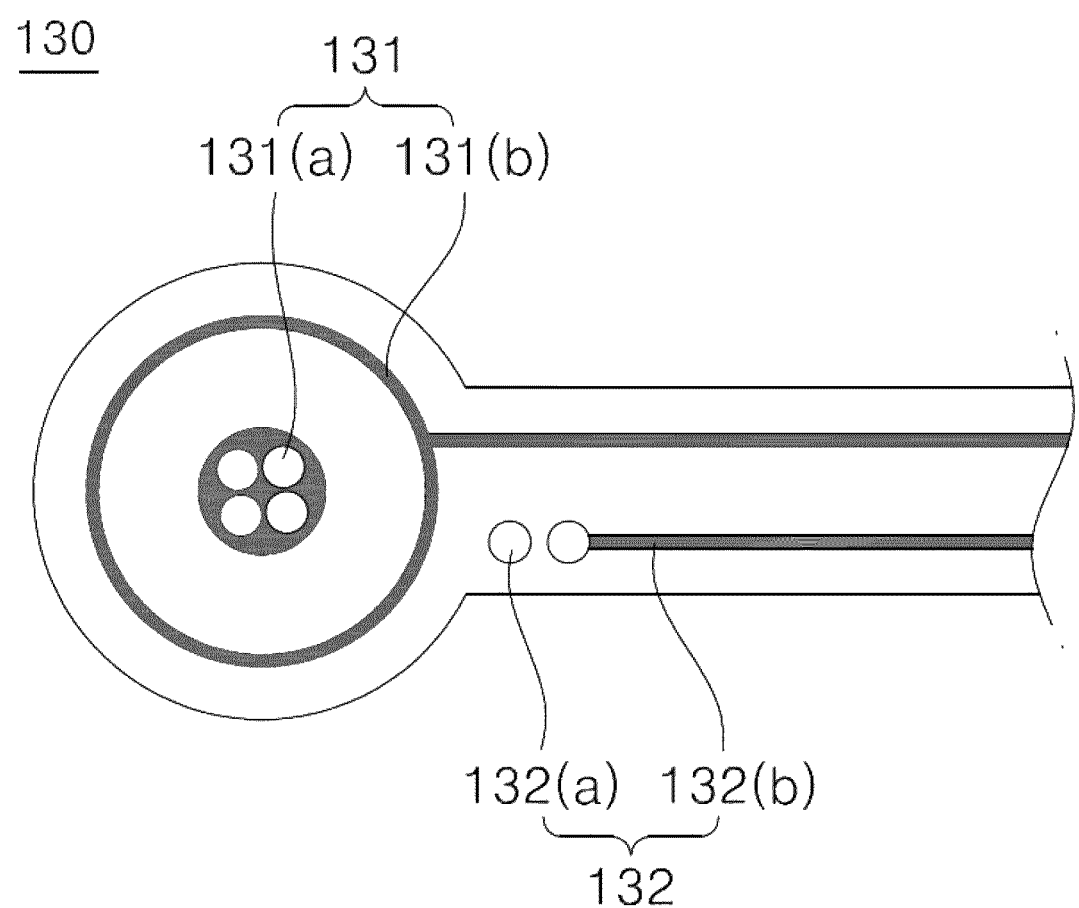

[FIG. 6]
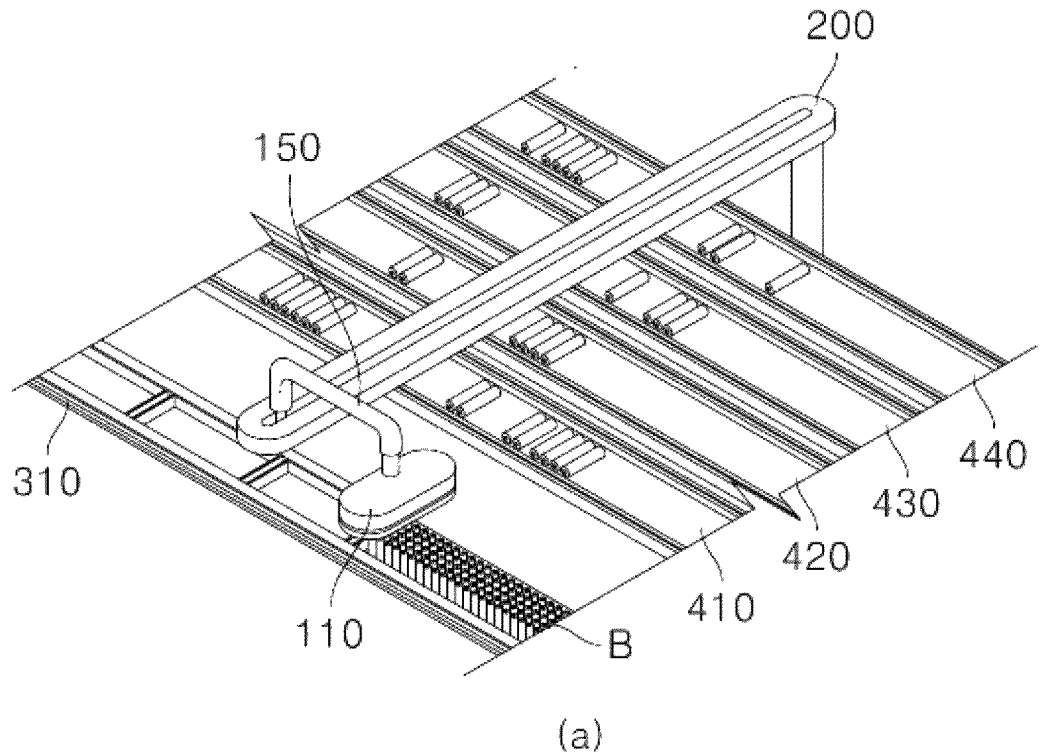
(a)
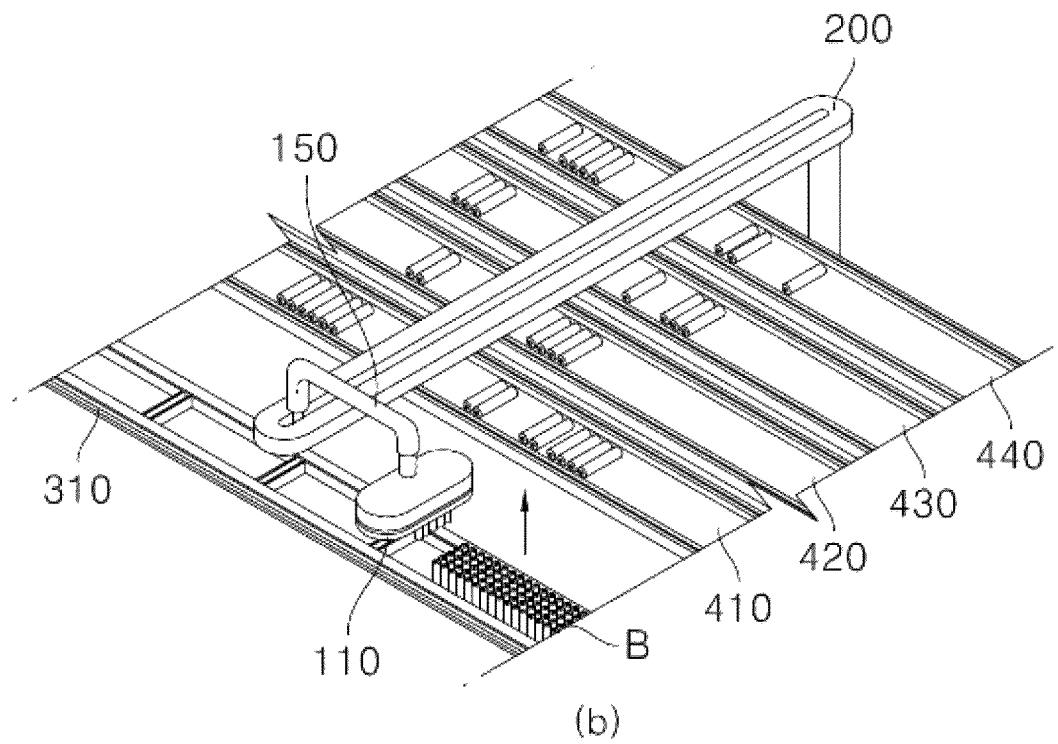
(b)

[FIG. 7]
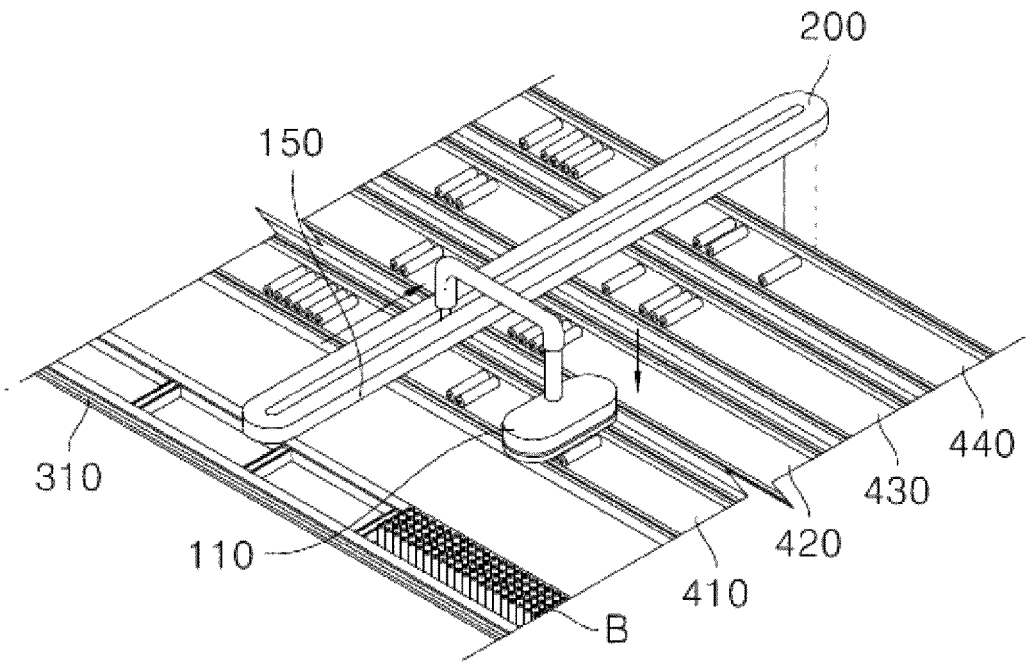
(c)
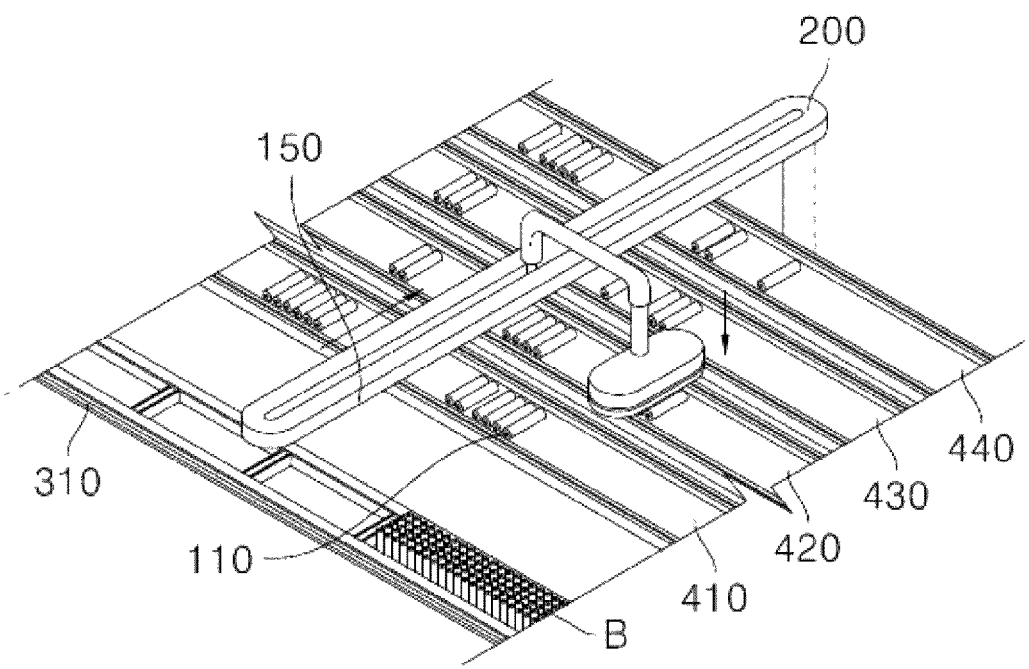
(d)

CYLINDRICAL BATTERY CELL SORTING APPARATUS AND SORTING METHOD USING THE SAME

TECHNICAL FIELD

This application claims the benefit of priority to Korean Patent Application No. 2020-0001349 filed on Jan. 6, 2020, the disclosure of which is hereby incorporated by reference herein its entirety.

The present invention relates to a cylindrical battery cell sorting apparatus and a sorting method using the same, and more particularly to a cylindrical battery cell sorting apparatus capable of measuring the voltages of cylindrical battery cells and sorting the cylindrical battery cells by set zone value and a sorting method using the same.

BACKGROUND ART

With technological development of mobile devices, such as mobile phones, laptop computers, camcorders, and digital cameras, and an increase in demand therefor, research on secondary batteries, which are capable of being charged and discharged, has been actively conducted. In addition, secondary batteries, which are energy sources substituting for fossil fuels causing air pollution, have been applied to an electric vehicle (EV), a hybrid electric vehicle (HEV), and a plug-in hybrid electric vehicle (P-HEV), and therefore there is an increasing necessity for development of secondary batteries.

There are a nickel-cadmium battery, a nickel-hydride battery, a nickel-zinc battery, and a lithium secondary battery as currently commercialized secondary batteries. Thereamong, the lithium secondary battery is in the spotlight, since the lithium secondary battery has little memory effect, whereby the lithium secondary battery is capable of being freely charged and discharged, has a very low self-discharge rate, and has high energy density, compared to the nickel-based secondary batteries.

Meanwhile, in the case in which the above secondary battery is used in a device that requires large capacity and high voltage, such as an electric vehicle, the secondary battery is used in the form of a battery cell assembly or a battery pack having a structure in which a plurality of battery cells is arranged.

At this time, the plurality of battery cells is connected to each other in series and/or in parallel in order to provide desired voltage or capacity. Consequently, it is the most ideal that all battery cells have the same voltage. However, there is limitation in manufacturing all battery cells so as to have the same voltage. For this reason, battery cells are manufactured so as to have minimum deviation in voltage.

In connection therewith, Korean Patent Application Publication No. 2017-0065764 discloses a battery cell sorting apparatus including a lifting member configured to lift or lower a battery cell, a voltage measurement member configured to measure the voltage of the battery cell, and a rotating member configured to rotate the lifting member such that the battery cell is placed in any one of a plurality of set zones according to a range belonging to the measured voltage thereof, wherein, when the battery cell arrives at any one of the plurality of set zones, the battery cell is separated from the lifting member and thus sorted.

According to the above prior art document, it has advantages in that battery cells can be sorted by set zone voltage value using the battery cell sorting apparatus, whereby it is possible to minimize deviation in voltage to thus maximize capacity at the time of manufacture of secondary batteries.

However, the battery cell sorting apparatus of the above prior art document is an apparatus for sorting pouch-shaped battery cells each having a large surface. In sorting cylindrical battery cells, therefore, it is not possible to utilize main components of the above prior art document, such as the lifting member and the voltage measurement member, without change. Furthermore, in the case in which a lifting plate is curved or an electrode needle is bent even to a slight degree, an electrode portion of each battery cell cannot come into contact with the electrode needle, which is configured to perform voltage measurement, whereby it is not possible to measure the voltage of the battery cell.

PRIOR ART DOCUMENT (Patent Document 1) Korean Patent Application Publication No. 2017-0065764

DISCLOSURE

Technical Problem

The present invention has been made in view of the above problems, and it is an object of the present invention to provide a cylindrical battery cell sorting apparatus capable of sorting cylindrical battery cells by set zone voltage value, whereby it is possible to minimize deviation in voltage at the time of manufacture of secondary batteries.

It is another object of the present invention to provide a cylindrical battery cell sorting apparatus including a voltage measurement unit configured to stably contact terminals of a cylindrical battery cell.

It is a further object of the present invention to provide a cylindrical battery cell sorting method of sorting cylindrical battery cells by set zone voltage value.

Technical Solution

In order to accomplish the above objects, a battery cell sorting apparatus according to the present invention includes a battery cell pickup member (100) configured to move a battery cell (B) to a desired position and a guide member (200) configured to guide the battery cell pickup member (100) in a horizontal direction, wherein the battery cell pickup member (100) includes a pickup body portion (110), a magnet (120) located at the lower surface of the pickup body portion (110), the magnet being configured to lift the battery cell (B), and a voltage measurement unit (130) located at the lower surface of the magnet (120), the voltage measurement unit being configured to measure the voltage of the battery cell (B).

Also, in the battery cell sorting apparatus according to the present invention, the battery cell pickup member (100) may be provided with a plurality of magnets (120) configured to lift a plurality of battery cells (B).

Also, in the battery cell sorting apparatus according to the present invention, the battery cell pickup member (100) may be provided with voltage measurement units (130) equal in number to the magnets (120), the voltage measurement units being configured to individually measure the voltages of the plurality of battery cells (B).

Also, in the battery cell sorting apparatus according to the present invention, the magnets (120) may be electromagnets.

Also, in the battery cell sorting apparatus according to the present invention, the battery cell pickup member (100) may be further provided with controllers (140) configured to supply power to the electromagnets or to interrupt the supply of power to the electromagnets and to determine whether the measured voltages correspond to a predetermined range.

Also, the battery cell sorting apparatus according to the present invention may further include a battery cell supply member (300) configured to supply battery cells (B) to be sorted by voltage, wherein the battery cell supply member (300) may include a conveyor (310) and at least one battery cell loading box (320) configured to receive a plurality of battery cells (B), the at least one battery cell loading box (320) being located on the conveyor (310).

Also, the battery cell sorting apparatus according to the present invention may further include a battery cell receiving member (400) configured to temporarily receive battery cells (B), the voltage of each of which has been measured.

Also, in the battery cell sorting apparatus according to the present invention, the battery cell receiving member (400) may be provided in a plurality of numbers, and battery cells (B) corresponding to the predetermined range may be received in a receiving portion having an identical space.

Also, in the battery cell sorting apparatus according to the present invention, the battery cell receiving member (400) may be a conveyor.

Also, in the battery cell sorting apparatus according to the present invention, the voltage measurement unit (130) may be a pad type flexible printed circuit board (FPCB).

Also, in the battery cell sorting apparatus according to the present invention, the battery cell may be cylindrical.

In addition, a battery cell sorting method according to the present invention includes a first step of supplying a battery cell to be sorted based on the voltage thereof; a second step of lifting the supplied battery cell; a third step of measuring the voltage of the battery cell and determining the position of a receiving portion corresponding to the battery cell; and a fourth step of moving the battery cell and placing the battery cell in the determined receiving portion.

Also, in the battery cell sorting method according to the present invention, in the second step and the fourth step, the battery cell may be lifted or placed in the receiving portion using electromagnetic force.

Also, in the battery cell sorting method according to the present invention, the first step to the fourth step may be repeatedly performed.

Also, in the battery cell sorting method according to the present invention, the battery cell may be cylindrical.

Advantageous Effects

A cylindrical battery cell sorting apparatus according to the present invention and a sorting method using the same have an advantage in that battery cells are moved by magnetic force and the voltages of the battery cells are measured while moving the battery cells, whereby it is possible to sort cylindrical battery cells by set zone voltage value.

In addition, the cylindrical battery cell sorting apparatus according to the present invention and the sorting method using the same have an advantage in that a voltage measurement unit constituted by a pad type flexible printed circuit board is located under a magnet, whereby the voltage measurement unit stably contacts a positive electrode terminal and a negative electrode terminal of a battery cell, whereby it is possible to improve reliability in measured voltage.

DESCRIPTION OF DRAWINGS

FIG. 1 is a plan view of a cylindrical battery cell sorting apparatus according to a preferred embodiment of the present invention.

FIG. 2 is an enlarged perspective view of battery cell pickup member of the cylindrical battery cell sorting apparatus according to the preferred embodiment of the present invention.

FIG. 3 is a sectional view of battery cell pickup member taken along line A-A' of FIG. 2.

FIG. 4 is a sectional view of the battery cell pickup member of the cylindrical battery cell sorting apparatus according to the preferred embodiment of the present invention when viewed from the front.

FIG. 5 is an enlarged plan view of a voltage measurement unit of the cylindrical battery cell sorting apparatus according to the preferred embodiment of the present invention.

FIGS. 6 and 7 are views illustrating a method of sorting battery cells by voltage zone using the battery cell sorting apparatus according to the present invention.

BEST MODE

In the present application, it should be understood that the terms "comprises," "has," "includes," etc. specify the presence of stated features, numbers, steps, operations, elements, components, or combinations thereof, but do not preclude the presence or addition of one or more other features, numbers, steps, operations, elements, components, or combinations thereof.

In addition, the same reference numbers will be used throughout the drawings to refer to parts that perform similar functions or operations. In the case in which one part is said to be connected to another part in the specification, not only may the one part be directly connected to the other part, but also, the one part may be indirectly connected to the other part via a further part. In addition, that a certain element is included does not mean that other elements are excluded, but means that such elements may be further included unless mentioned otherwise.

Hereinafter, a cylindrical battery cell sorting apparatus according to the present invention and a sorting method using the same will be described.

FIG. 1 is a plan view of a cylindrical battery cell sorting apparatus according to a preferred embodiment of the present invention. The cylindrical battery cell sorting apparatus according to the present invention will be described first with reference to FIG. 1. The cylindrical battery cell sorting apparatus includes a battery cell pickup member 100, a guide member 200, a battery cell supply member 300, and a battery cell receiving member 400.

Specifically, the battery cell pickup member 100 is configured to measure the voltage of each cylindrical battery cell B that is continuously or discontinuously supplied and to transfer the battery cell B to a predetermined position based on the measured voltage thereof. The battery cell pickup member is movable in a longitudinal direction of the guide member 200 and at the same time can be driven in a vertical direction. The construction of the battery cell pickup member related therewith will be described below in detail.

The guide member 200 is configured to cross above the battery cell receiving member 400, and is also configured to support the battery cell pickup member 100 such that the battery cell pickup member 100 can be safely moved in a leftward-rightward direction or in a horizontal direction.

The battery cell supply member 300 is configured to supply a plurality of cylindrical battery cells B, the voltage of each of which is necessary to be measured, and includes a conveyor 310 and a battery cell loading box 320.

Specifically, at least one battery cell loading box 320 is located on the conveyor 310, which is configured to be continuously or discontinuously moved in one direction. A plurality of battery cells B is received in the battery cell loading box 320.

Here, each of the battery cells B is received in the battery cell loading box 320 in an erected state such that a positive electrode terminal of the battery cell faces upwards. The reason for this is that it is possible to measure the voltage of the battery cell B, as will be described below.

It is preferable that the conveyor 310 be moved in a direction perpendicular to the longitudinal direction of the guide member 200. A plurality of battery cell loading boxes 320 is seated on the conveyor 310 such that continuous work is possible.

Meanwhile, although a plurality of battery cells B is shown as being supplied in the state of being received in each battery cell loading box 320 in the figure, it is possible to supply the plurality of battery cells in the state of being placed on the upper surface of the conveyor 310 without the battery cell loading box 320.

The battery cell receiving member 400 is a member configured to temporarily receive cylindrical battery cells B, the voltage of each of which has been measured. Voltages of all battery cells B are measured using the battery cell pickup member 100, the battery cells B are sorted into a plurality of zones based on the measured voltages thereof, and battery cells B having similar voltage ranges are received in the same zone.

For example, the battery cell receiving member 400 may include four battery cell receiving portions. A first battery cell receiving portion 410 may receive battery cells B having a voltage of higher than 3.580V and lower than or equal to 3.583V, a second battery cell receiving portion 420 may receive battery cells B having a voltage of higher than 3.583V and lower than or equal to 3.586V, a third battery cell receiving portion 430 may receive battery cells B having a voltage of higher than 3.586V and lower than or equal to 3.589V, and a fourth battery cell receiving portion 440 may receive battery cells B having a voltage of higher than 3.589V and lower than or equal to 3.592V. However, this configuration is merely an example. The number of receiving portions and the voltage range for each of the receiving portions may be changed without limit.

Here, the first battery cell receiving portion 410 to the fourth battery cell receiving portion 440 may be conveyors configured to be continuously or intermittently moved, or may be boxes each having a shape similar to the shape of the battery cell supply member.

Next, the battery cell pickup member 100 and the guide member 200 will be described in detail.

FIG. 2 is an enlarged perspective view of the battery cell pickup member of the cylindrical battery cell sorting apparatus according to the preferred embodiment of the present invention, FIG. 3 is a sectional view of the battery cell pickup member taken along line A-A' of FIG. 2, and FIG. 4 is a sectional view of the battery cell pickup member of the cylindrical battery cell sorting apparatus according to the preferred embodiment of the present invention when viewed from the front.

The battery cell pickup member 100 constituting the cylindrical battery cell sorting apparatus according to the present invention includes a pickup body portion 110, a magnet 120, a voltage measurement unit 130, a controller 140, and a lifting portion 150.

The pickup body portion 110 is configured to fix or seat the magnet 120, the voltage measurement unit 130, and the controller 140 in order to provide an integrated battery cell pickup member 100. The lifting portion 150, which is configured to move the pickup body portion 110 upwards and downwards, is connected to the pickup body portion 110 at a predetermined position thereof.

The pickup body portion 110 may be provided with a plurality of magnets 120, more specifically four magnets 120, which is the same number as the battery cell receiving portions described above. The magnets 120 are located at the lower surface of the pickup body portion 110 so as to be spaced apart from each other by a predetermined distance. When the pickup body portion 110 comes into tight contact with cylindrical battery cells B received in the battery cell loading box 320 or approaches the cylindrical battery cells, therefore, the cylindrical battery cells B cling to the pickup body portion 110 by magnetic force.

Here, it is preferable that the magnet 120 be an electromagnet configured to be magnetized when current flows therein and to be demagnetized when no current flows therein. The reason for this is that it is possible to conveniently lift the cylindrical battery cell B and to place the lifted cylindrical battery cell at a desired position.

Meanwhile, in the figures, protrusions 121 of the magnet 120 are shown as being exposed outwards from the upper surface and the lower surface of the pickup body portion 110, and a bridge 122 configured to connect the pair of protrusions 121 to each other is shown as extending through the pickup body portion 110. However, this configuration is merely an example. It is obvious that the shape of the magnet 120 can be variously changed, for example, the magnet is embedded in the pickup body portion 110, as long as the magnet can be magnetized and demagnetized depending on whether or not current is supplied thereto.

The voltage measurement unit 130, which is configured to measure the voltage of the cylindrical battery cell B, is located under the magnet 120. The voltage measurement unit 130 will be described in more detail with reference to FIG. 5, which is an enlarged plan view of the voltage measurement unit of the cylindrical battery cell sorting apparatus according to the preferred embodiment of the present invention. The voltage measurement unit is a pad type flexible printed circuit board (FPCB), and includes a tight contact portion 131 configured to contact the outer end surface of the upper part of the battery cell B and an extension portion 132 extending along the outer surface of the pickup body portion 110 so as to be connected to the controller 140.

In addition, a first via hole 131(a) configured to electrically contact a positive electrode terminal of the battery cell B is located at the center of the tight contact portion 131, and a circular negative electrode line 131(b) configured to contact a negative electrode terminal of the battery cell B is provided at the outer circumference of the first via hole 131(a).

The first via hole 131(a) is electrically connected to a second via hole 132(a) of the extension portion 132. A positive electrode line 132(b), which is connected to the second via hole 132(a), is connected to the controller 140. The circular negative electrode line 131(b) extends to the extension portion 132 and is then connected to the controller 140 in the same manner.

That is, when the magnet 120 is located above the cylindrical battery cell B, the magnet 120 comes into tight contact with the battery cell B in the state in which the voltage measurement unit 130 is interposed therebetween by magnetic force. At this time, the controller 140 measures and determines the voltage of the battery cell B.

Conventionally, the movement of the battery cell and the measurement of the voltage of the battery cell are performed as separate processes, whereby productivity is low. In the present invention, however, there is an advantage in that the cylindrical battery cell B is moved by magnetic force and the voltage of the battery cell is measured while the battery cell is moved, whereby it is possible to reduce overall production time.

Meanwhile, the flexible printed circuit board (FPCB), which is the voltage measurement unit 130, is technology widely applied to other technical fields, and therefore a detailed description thereof will be omitted. Also, in the present invention, the voltage measurement unit 130, as shown in FIG. 5, was described by way of example. However, this is merely an example. The voltage measurement unit is not particularly restricted as long as the voltage measurement unit has a structure capable of electrically contacting the positive electrode terminal and the negative electrode terminal of the cylindrical battery cell B and transmitting a corresponding signal to the controller 140.

The controller 140 will be described with reference back to FIGS. 2 to 4. The controller 140 supplies power to the magnet 120 or interrupts the supply of power to the magnet. The controller 140 measures the voltage of the battery cell B, and determines to which range the measured voltage corresponds.

Specifically, when the pickup body portion 110 is located above the battery cell B supplied through the conveyor 310, the controller supplies power to the magnet 120 such that the magnet can lift the battery cell B, measures the voltage of the battery cell B from a signal transmitted from the voltage measurement unit 130, and determines in which zone of the battery cell receiving member 400 the battery cell B is to be located.

In addition, when the battery cell pickup member 100 is moved to the battery cell receiving member 400 along the guide member 200 and arrives at the receiving portion in which the battery cell B is to be received, i.e. one of the first battery cell receiving portion 410 to the fourth battery cell receiving portion 440, current supplied to the magnet corresponding to the battery cell B is interrupted such that the battery cell B is dropped. The movement of the remaining battery cells 13 and the interruption of supply of power to the magnets corresponding thereto are repeatedly performed such that the battery cells are sorted to the determined receiving portions.

One side of the lifting portion 150 is connected to the pickup body portion 110, and the other side of the lifting portion extends to the guide member 200. The lifting portion is configured to move the pickup body portion 110 upwards or downwards by a predetermined height. The lifting portion may be a piston. However, the lifting portion is not particularly restricted as long as it is possible to perform the same function as described.

Next, a method of sorting battery cells by voltage range using the cylindrical battery cell sorting apparatus described above will be described.

FIGS. 6 and 7 are views illustrating a method of sorting battery cells by voltage zone using the battery cell sorting apparatus according to the present invention.

The cylindrical battery cell sorting method according to the present invention includes a first step of supplying a cylindrical battery cell B to be sorted based on the voltage thereof, a second step of measuring the voltage of the supplied cylindrical battery cell B while lifting the cylindrical battery cell, a third step of determining the voltage zone of the cylindrical battery cell B and selecting the receiving portion in which the cylindrical battery cell B is to be received, and a fourth step of moving the cylindrical battery cell B and placing the cylindrical battery cell in the selected receiving portion. The above steps may be repeatedly performed.

First, the first step ((a) of FIG. 6) is a step of supplying cylindrical battery cells B to be sorted by voltage. A predetermined number of cylindrical battery cells B are supplied in the state of being received in a battery cell loading box 320. Of course, only the cylindrical battery cells B may be supplied without being loaded in the box.

The second step ((b) of FIG. 6) is a step of lifting the cylindrical battery cells. In order to lift the battery cells, power must be supplied to the magnets 120. It is preferable that power be supplied to the magnets 120 when the pickup body portion 110 approaches the cylindrical battery cells B. Alternatively, power may be supplied to the magnets 120 after the fourth step.

The third step ((c) of FIG. 7) is a step of measuring the voltage of each of the cylindrical battery cells B and determining the receiving portion in which the cylindrical battery cell B is to be received. As an example, in the case in which the voltages of the cylindrical battery cells B attached respectively to the four magnets 120 are 3.581V, 3.587V, 3.588V, and 3.591V, the battery cell of 3.581V is determined to be received in the first battery cell receiving portion 410, the battery cells of 3.587V and 3.588V are determined to be received in the third battery cell receiving portion 430, and the battery cell of 3.591V is determined to be received in the fourth battery cell receiving portion 440.

The final fourth step ((d) of FIG. 7) is a step of moving the pickup body portion 110 along the guide member 200 and dropping the cylindrical battery cell B when the cylindrical battery cell B arrives at the position determined in the third step.

The final fourth step is a step of moving the pickup body portion 110 along the guide member 200 and dropping the cylindrical battery cell B when the cylindrical battery cell B arrives at the position determined in the third step.

In order to drop the cylindrical battery cell B, the supply of current to the magnet 120 corresponding thereto must be interrupted. The position of each battery cell receiving portion may be determined based on the movement distance of the pickup body portion 110. Alternatively, separate position sensors (not shown) may be mounted to the pickup body portion 110 and the first battery cell receiving portion 410 to the fourth battery cell receiving portion 440 such that the supply of current to a corresponding one of the magnets 120 is interrupted when the pickup body portion arrives at a predetermined position.

Meanwhile, it is more preferable that power be supplied to the magnets 120 in the first step, although power may be supplied to the magnets 120 immediately after all of the cylindrical battery cells B attached to the pickup body portion 110 are dropped into receiving portions corresponding thereto.

In the accompanying drawings, the cylindrical battery cells received in the first battery cell receiving portion 410 to the fourth battery cell receiving portion 440 are shown as lying on their sides. Alternatively, the cylindrical battery cells may be disposed upright.

Although the specific details of the present invention have been described in detail, those skilled in the art will appreciate that the detailed description thereof discloses only preferred embodiments of the present invention and thus does not limit the scope of the present invention. Accordingly, those skilled in the art will appreciate that various changes and modifications are possible, without departing from the category and the technical idea of the present invention, and it will be obvious that such changes and modifications fall within the scope of the appended claims.

DESCRIPTION OF REFERENCE SYMBOLS

100: Battery cell pickup member
110: Pickup body portion
120: Magnet
121: Protrusion 122: Bridge
130: Voltage measurement unit
131: Tight contact portion
131(a): First via hole 131(b): Negative electrode line
132: Extension portion
132(a): Second via hole 132(b): Positive electrode line
140: Controller
150: Lifting portion
200: Guide member
300: Battery cell supply member
310: Conveyor
320: Battery cell loading box
400: Battery cell receiving member
410: First battery cell receiving portion
420: Second battery cell receiving portion
430: Third battery cell receiving portion
440: Fourth battery cell receiving portion
B: Battery cell

The invention claimed is:

1. A battery cell sorting apparatus comprising:
a battery cell pickup member configured to move a battery cell to a desired position; and
a guide member configured to guide the battery cell pickup member in a first direction,
wherein the battery cell pickup member comprises:
a pickup body portion,
a magnet located at a lower surface of the pickup body portion, the magnet being configured to lift the battery cell, and
a voltage measurement unit located at a lower surface of the magnet, the voltage measurement unit being configured to measure a voltage of the battery cell, and
wherein the magnet is interposed between the pickup body portion and the voltage measuring unit when the voltage of the battery cell is being measured.

2. The battery cell sorting apparatus according to claim 1, wherein the battery cell pickup member is provided with a plurality of magnets configured to lift a plurality of battery cells.

3. The battery cell sorting apparatus according to claim 2, wherein the battery cell pickup member is provided with voltage measurement units equal in number to the plurality of magnets, the voltage measurement units being configured to individually, measure voltages of the plurality of battery cells.

4. The battery cell sorting apparatus according to claim 3, wherein the plurality of magnets are electromagnets.

5. The battery cell sorting apparatus according to claim 4, wherein the battery cell pickup member is further provided with controllers configured to supply power to the electromagnets or to interrupt supply of power to the electromagnets and to determine whether the measured voltages correspond to a predetermined range.

6. The battery cell soiling apparatus according to claim 5, further comprising:
a battery cell supply member configured to supply the plurality of battery cells to be sorted by voltage,
wherein the battery cell supply member comprises a conveyor and at least one battery cell loading box configured to receive the plurality of battery cells, the at least one battery cell loading box being located on the conveyor.

7. The battery cell sorting apparatus according to claim 5, further comprising a battery cell receiving member configured to temporarily receive the plurality of battery cells, a voltage of each of which has been measured, and
wherein guide member has a longitudinal length that extends across the battery cell receiving member in the first direction.

8. The battery cell sorting apparatus according to claim 7, wherein the battery cell receiving member is provided in a plurality of numbers and the predetermined range is provided in a plurality of numbers of different ranges, and
wherein the plurality of battery cells corresponding to one or more of the predetermined ranges are received in a receiving portion of the corresponding battery receiving member having a space in sequential order according to the predetermined ranges as the battery cell pickup member moves along the longitudinal length of the guide member to the corresponding battery, receiving member from among the plurality of battery receiving members.

9. The battery cell sorting apparatus according to claim 8, wherein the battery cell receiving member is a conveyor.

10. The battery cell sorting apparatus according to claim 1, wherein the voltage measurement unit is a pad type flexible printed circuit board (FPCB).

11. The battery cell sorting apparatus according to claim 1, wherein the battery cell is cylindrical.

12. A sorting method using the battery cell sorting apparatus according to claim 1, the sorting method comprising:
a first operation of supplying a battery cell to be sorted based on a voltage thereof;
a second operation of lifting the supplied battery cell;
a third operation of measuring a voltage of the battery cell and determining a position of a receiving portion corresponding to the battery cell; and
a fourth operation of moving the battery cell and placing the battery cell in the determined receiving portion.

13. The sorting method according to claim 12, wherein, in the second operation and the fourth operation, the battery cell is lifted or placed in the receiving portion using electromagnetic force.

14. The sorting method according to claim 13, wherein the first operation to the fourth operation are repeatedly performed.

15. The sorting method according to claim 12, wherein the battery cell is cylindrical.

16. The sorting method according to claim 12, wherein, in the third operation, the position of the receiving portion corresponding to the battery cell is based on the measured voltage of the battery cell.

17. The battery cell sorting apparatus according to claim 1, wherein the voltage measurement unit includes a contact portion configured to contact an outer end surface of an upper part of the battery cell, and an extension portion, and
wherein the contact portion includes a first via hole to contact a first terminal of the battery cell, and a first electrode line at an outer periphery of the first via hole to contact a second terminal of the battery cell.

18. The battery cell sorting apparatus according to claim 17, wherein the voltage measurement unit includes a second via hole electrically connected to the first via hole, and a second electrode line connected to the second via hole.

\* \* \* \* \*